(12) United States Patent
Chen et al.

(10) Patent No.: US 9,165,997 B2
(45) Date of Patent: Oct. 20, 2015

(54) SEMICONDUCTOR PROCESS

(71) Applicant: UNITED MICROELECTRONICS CORP., Hsin-Chu (TW)

(72) Inventors: Chieh-Te Chen, Kaohsiung (TW); Yi-Po Lin, Tainan (TW); Jiunn-Hsiung Liao, Tainan (TW); Shui-Yen Lu, Tainan (TW); Li-Chiang Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/583,122

(22) Filed: Dec. 25, 2014

(65) Prior Publication Data

US 2015/0126015 A1 May 7, 2015

Related U.S. Application Data

(62) Division of application No. 13/369,260, filed on Feb. 8, 2012, now Pat. No. 8,952,392.

(51) Int. Cl.
*H01L 21/20* (2006.01)
*H01L 21/332* (2006.01)
*H01L 49/02* (2006.01)
*H01L 27/06* (2006.01)
*H01L 21/768* (2006.01)
*H01L 29/66* (2006.01)

(52) U.S. Cl.
CPC .......... *H01L 28/20* (2013.01); *H01L 21/76897* (2013.01); *H01L 27/0629* (2013.01); *H01L 28/24* (2013.01); *H01L 29/66545* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ......... 438/136, 137, 156, 173, 192, 206, 212, 438/424, 427, 428, 591; 257/20, 194, 257/135–136, 213–413, 900, 902–903
See application file for complete search history.

(56) References Cited

U.S. PATENT DOCUMENTS

| 2006/0065939 | A1 | 3/2006 | Doczy |
| 2007/0166998 | A1 | 7/2007 | Wu |
| 2008/0191287 | A1 | 8/2008 | Chou |
| 2010/0059833 | A1* | 3/2010 | Yu et al. ........................ 257/410 |
| 2010/0328022 | A1 | 12/2010 | Fan |

OTHER PUBLICATIONS

Chen, U.S. Appl. No. 13/267,068, filed Oct. 6, 2011.

* cited by examiner

*Primary Examiner* — Selim Ahmed
*Assistant Examiner* — Moin Rahman
(74) *Attorney, Agent, or Firm* — Winston Hsu; Scott Margo

(57) ABSTRACT

A semiconductor structure includes a substrate, a resist layer, a dielectric material, two U-shaped metal layers and two metals. The substrate has an isolation structure. The resist layer is located on the isolation structure. The dielectric material is located on the resist layer. Two U-shaped metal layers are located at the two sides of the dielectric material and on the resist layer. Two metals are respectively located on the two U-shaped metal layers. This way a semiconductor process for forming said semiconductor structure is provided.

10 Claims, 5 Drawing Sheets

SEMICONDUCTOR PROCESS

CROSS REFERENCE TO RELATED APPLICATIONS

This application is a divisional application of and claims the benefit of U.S. patent application Ser. No. 13/369,260, filed Feb. 8, 2012.

BACKGROUND OF THE INVENTION

1. Field of the Invention

The present invention relates generally to a semiconductor structure and process thereof, and more specifically to a semiconductor structure and process thereof, which includes a resistor structure having two U-shaped metal layers located at the two sides of a dielectric material.

2. Description of the Prior Art

In a semiconductor process, polysilicon is often used in forming resistors capable of providing high resistance. These resistors can be used in place of load transistors. When load transistors of a static random access memory (SRAM) is replaced by polysilicon resistors, the number of transistors in the SRAM can be lowered which reduce costs and enhance the integration ratio of the SRAM.

The steps of forming resistor structures by polysilicon may include covering a silicon nitride layer on a reserved polysilicon area to define a location of a polysilicon resistor by exposing a polysilicon area to remove. Then, the polysilicon of the reserved polysilicon area is removed by methods such as etching processes, so that contact holes for forming contact plugs of interconnects to electrically connect polysilicon resistors with wires are formed in the reserved polysilicon area.

But said process still has a few drawbacks. For instance, a height difference between the reserved polysilicon area and other areas can arise after the etching process is performed because of the covering of the silicon nitride layer on the reserved polysilicon area. The height difference can lead to an incomplete polishing process of metals used to fill the contact holes for forming the contact plugs, and the some metal may remain outside of the contact holes. Besides, the polysilicon of the polysilicon area to remove is hard to be removed by etching processes. For example, the polysilicon of the polysilicon area to remove will be over-etched when only a dry etching process is performed, which can damage the structures below the polysilicon. The polysilicon of the reserved polysilicon area covered by the silicon nitride layer will be etched through as the polysilicon of the polysilicon area to remove is etched by a dry etching process coupled with a wet etching process, due to the wet etching process being an anisotropic etching process. As a result, holes will be hard to fill with metals, which affecting the performances of polysilicon resistors.

SUMMARY OF THE INVENTION

The present invention provides a semiconductor structure and process thereof to solve said problems.

The present invention provides a semiconductor structure including a substrate, a resist layer, a dielectric material, two U-shaped metal layers and two metals. The substrate has an isolation structure. The resist layer is located on the isolation structure. The dielectric material is located on the resist layer. Two U-shaped metal layers are located at the two sides of the dielectric material and on the resist layer. Two metals are respectively located on the two U-shaped metal layers.

The present invention provides a semiconductor process including the following steps. A substrate having an isolation structure is provided. A sacrificial resist is formed on the isolation structure, wherein the sacrificial resist comprises a resist layer formed on the isolation structure and a sacrificial layer formed on the resist layer. A middle part of the sacrificial layer is removed and a first recess is therefore formed while two end sides of the sacrificial layer still remain. A dielectric material is formed in the first recess. The two end sides of the sacrificial layer are removed and two second recesses are respectively formed. A U-shaped metal layer and a metal are sequentially formed on each of the second recesses.

According to the above, the present invention provides a semiconductor structure and process thereof, which replaces the polysilicon layer of the prior art with the dielectric material. Thus, the problems of difficulty in filling holes, the etched through polysilicon and metal remain because of height difference can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
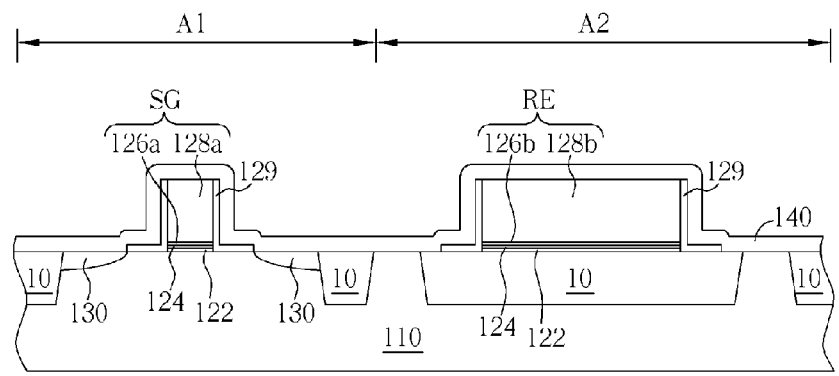
FIGS. 1-9 schematically depict cross-sectional views of a semiconductor process according to one embodiment of the present invention.

FIGS. 1-9 schematically depict cross-sectional views of a semiconductor process according to one embodiment of the present invention. As shown in FIG. 1, a substrate 110 having at least an isolation structure 10 is provided. The substrate 110 may be a semiconductor substrate such as a silicon substrate, a silicon containing substrate, an III-V group-on-silicon (such as GaN-on-silicon) substrate, a graphene-on-silicon substrate or a silicon-on-insulator (SOI) substrate. In this embodiment, the isolation structure 10 is a shallow trench isolation structure. In another embodiment, the isolation structure 10 may be a thermal oxidation structure or etc.

In this embodiment, the substrate 110 is divided into a transistor area and a resist area. A transistor is formed on the substrate 110 of the transistor area and a resistor structure is formed on the substrate 110 of the resist area. The transistor process for forming the transistor and the semiconductor process for forming the resistor structure of the present invention are performed at the same time; so the transistor and the resistor structure formed in different areas can be fabricated at once. In other words, this embodiment is just one application of the present invention. The semiconductor process of the present invention can be performed alone to form at least a resistor structure. The semiconductor process of the present invention can also be coupled with other processes to be all performed at the same time or at different time, depending upon the needs and processing environments. For clarity and simplifying the present invention, the semiconductor process of the present invention and the transistor process performed at the same time are described in this embodiment, and a transistor process will also be described while a semiconductor process of the present invention is described. However, the semiconductor process of the present invention will described again if the semiconductor process of the present invention is performed alone.

The semiconductor process is integrated with a gate last process for high-K first process as described below. Please refer to FIG. 1 again; a buffer layer 122 and a gate dielectric layer 124 are entirely formed on the substrate 110, wherein the buffer layer 122 and the gate dielectric layer 124 are formed at the same time in a transistor area A1 and a resistance area A2. In detail, the buffer layer 122 formed in the transistor area A1 is formed on the substrate 110 and the gate dielectric layer 124 is formed on the buffer layer 122; the buffer layer 122 formed in the resistance area A2 is formed on the isolation structure 10 and the gate dielectric layer 124 is formed on the buffer layer 122. The buffer layer 122 may be an oxide layer, formed by a thermal oxidation process or a deposition process etc. If the buffer layer 122 is formed by the thermal oxidation process, the buffer layer will not be formed on the isolation structure 10. The dielectric layer 124 may be a dielectric layer having a high dielectric constant, such as the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1$—$xO_3$, PZT) and barium strontium titanate ($Ba_xSr_1$—$xTiO_3$, BST). However, in an embodiment of forming the resistor structure alone, the buffer layer and the dielectric layer are not necessary components.

A barrier material and a sacrificial material are sequentially formed on the gate dielectric layer 124; the barrier material and the sacrificial material are then patterned by a lithography process so that a sacrificial gate SG in the transistor area A1 and a sacrificial resistance RE in the resistance area A2 are formed at the same time. The sacrificial gate SG includes a barrier layer 126a formed on the gate dielectric layer 124 and a sacrificial gate layer 128a formed on the barrier layer 126a. The sacrificial resistance RE includes a resist layer 126b formed on the gate dielectric layer 124 and a sacrificial layer 128b formed on the resist layer 126b. In this embodiment, the barrier layer 126a and the resist layer 126b are formed at the same time, and the sacrificial gate layer 128a and the sacrificial layer 128b are formed at the same time. The barrier layer 126a and the resist layer 126b may be titanium nitride layers and the sacrificial gate layer 128a and the sacrificial layer 128b may be polysilicon layers, but not limited thereto. In another embodiment, the barrier layer 126a and the resist layer 126b may be formed at different times and may be formed with different materials. The sacrificial gate layer 128a and the sacrificial layer 128b may be formed at different times as well. The processing steps can be simplified by applying the method of this embodiment, in which the barrier layer 126a and the resist layer 126b can be formed at the same time and the sacrificial gate layer 128a and the sacrificial layer 128b can be formed at the same time. In this embodiment, the resist layer 126b is formed on the gate dielectric layer 124 without directly contacting the isolation structure 10, due to the buffer layer 122 and the gate dielectric layer 124 being formed on the transistor area A1 and the resistance area A2. In another embodiment, the resist layer 126b may also be directly formed on the isolation structure 10 as the resistor structure is formed alone or the buffer layer 122 and the gate dielectric layer 124 are just formed in the transistor area A1.

After the sacrificial gate layer 128a and the sacrificial layer 128b are formed, a spacer 129 is respectively formed beside the sacrificial gate layer 128a and the sacrificial layer 128b. A source/drain region 130 may be formed in the substrate 110 in the transistor area A1 beside the spacer 129 by an ion implantation process. A contact hole etch stop layer 140 may be selectively entirely formed to cover the sacrificial gate layer 128a, the sacrificial layer 128b, the spacer 129 and the substrate 110. The contact hole etch stop layer 140 may be a silicon nitride layer or a doped silicon nitride layer etc. Moreover, a lightly doped source/drain region, a silicide and an epitaxial layer may be selectively formed beside the sacrificial gate layer 128a. These processes are known in the art, and are therefore not described herein.

Figure 2:
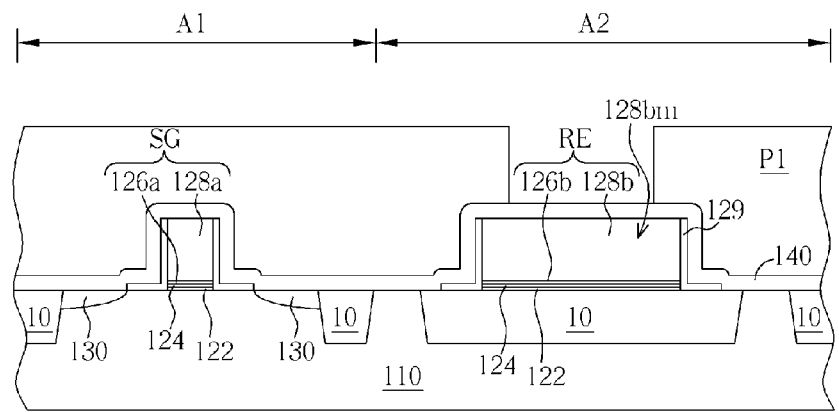
Figure 3:
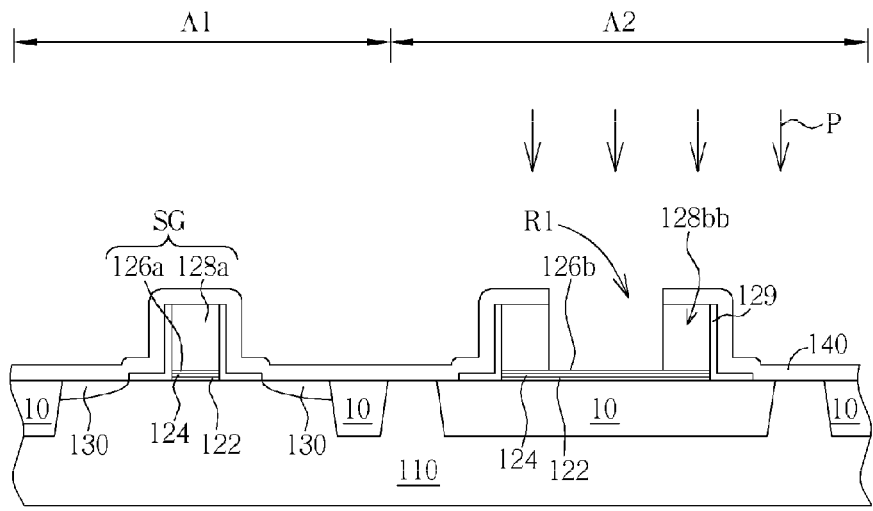

As shown in FIGS. 2-3, a middle part of the sacrificial layer 128bm is removed, so that a first recess R1 is formed while two end sides of the sacrificial layer 128bb are kept. As shown in FIG. 2, a photoresist layer (not shown) is formed to cover entirely the contact hole etch stop layer 140 and then the photoresist layer (not shown) is patterned to form a patterned photoresist layer P1. As shown in FIG. 3, the middle part of the sacrificial layer 128bm and the contact hole etch stop layer 140 right above the middle part of the sacrificial layer 128bm are removed, so that the first recess R1 is formed while the two end sides of the sacrificial layer 128bb remain. Therefore, the resist layer 126b under the middle part of the sacrificial layer 128bm is exposed. It is worth noting that a treatment process P may be selectively performed to form a first resist layer (not shown) on the resist layer 126b after the resist layer 126b is exposed, so that the resistance of the resist layer 126b can be adjusted by the treatment process P to have a resistance value approaching practical needs or to form resistances with different standards. For example, there are a plurality of resistance areas (not shown) having common or different sizes on the substrate 110, the resistances of the resist layer 126b in each resistance areas can be adjusted by at least one time of the treatment process P in the present invention. Moreover, the treatment process P may be a nitridation process, an oxidation process or an implantation process etc performed on the resist layer 126b to form a first resist layer (not shown) by transferring the surface of the resist layer 126b or to form a first resist layer (not shown) on the surface of the resist layer 126b by a depositing process, an etching process, etc.

Figure 4:
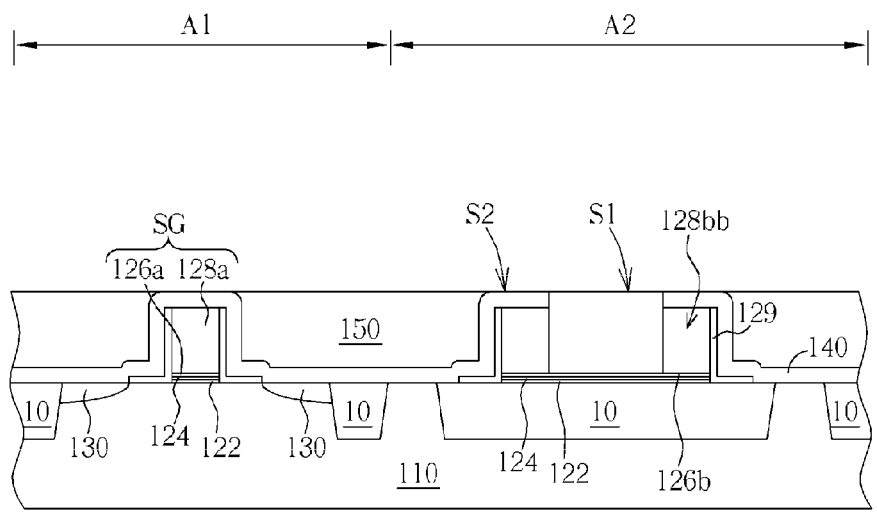

As shown in FIG. 4, a planarized dielectric material 150 is formed in the first recess R1. The method of forming the planarized dielectric material 150 may be: a dielectric material (not shown) entirely covers the substrate 110, the resist layer 126b and the two end sides of the sacrificial layer 128bb; then, the dielectric material (not shown) is planarized, so that the top surface S1 of the planarized dielectric material 150 is leveled with the top surface S2 of the contact hole etch stop layer 140 on the two end sides of the sacrificial layer 128bb. In a case where the contact hole etch stop layer 140 is not formed, the planarized dielectric material 150 is leveled with the two end sides of the sacrificial layer 128bb.

Figure 5:
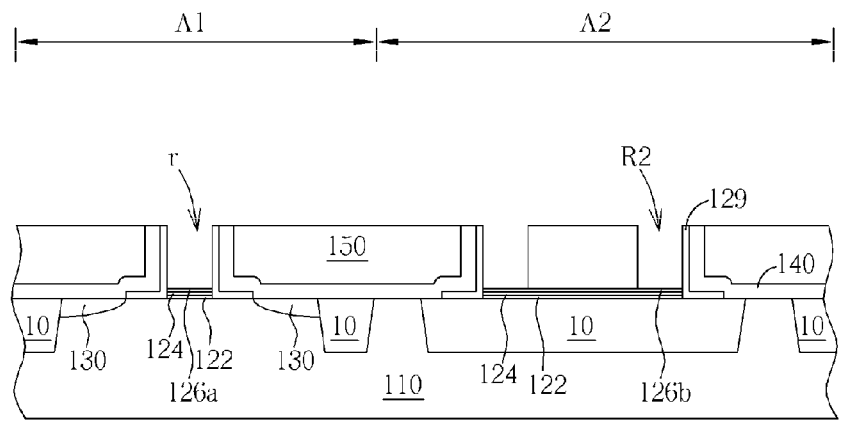

As shown in FIG. 5, two second recesses R2 and a gate recess r are respectively formed by removing the two end sides of the sacrificial layer 128bb and the sacrificial gate layer 128a. The method of removing the two end sides of the sacrificial layer 128bb may include performing a dry etching process and then performing a wet etching process. Since the middle part of the sacrificial layer 128bm is replaced by the planarized dielectric material 150, the method of sequentially performing a dry etching process and a wet etching process will not etch laterally the polysilicon, so the problems of difficulty in filling holes and the etched through polysilicon can be avoided. Besides, due to the middle part of the sacrificial layer 128bm being replaced by the planarized dielectric material 150, metals remaining outside of the contact holes leading to height difference problems can be avoided because the step of forming a silicon nitride layer on part of polysilicon can be omitted.

Figure 6:
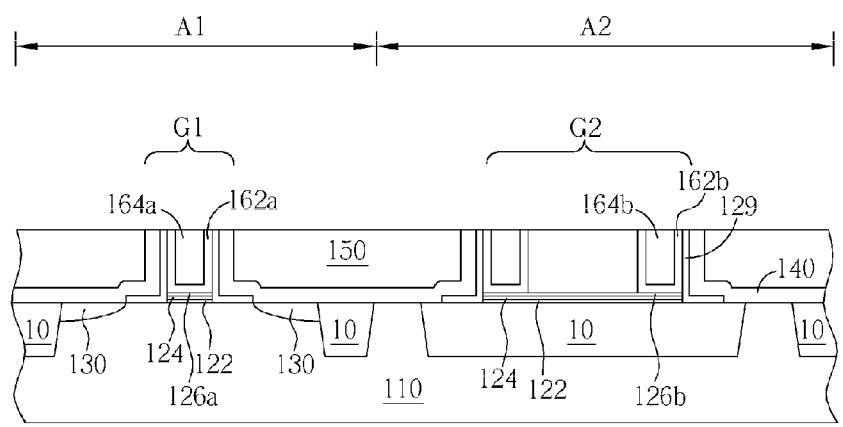

As shown in FIG. 6, a U-shaped metal layer 162b, a barrier layer (not shown) and a metal 164b are formed in each of the second recesses R2 while a U-shaped work function metal layer 162a, a barrier layer (not shown) and a metal electrode 164a are formed in the gate recess r. Therefore, the two spacers 129 are respectively located at the external sides of the two U-shaped metal layers 162b. In this way, the resistor structure G2 and the transistor G1 can be formed at the same time by a gate last process. In detail, metal layers (not shown) and a work function metal layer (not shown) are respectively formed into the second recesses R2 and the gate recess r at the same time, and then metals (not shown) and the metal electrode (not shown) are respectively formed into the second recesses R2 and the gate recess r at the same time. The metal layers (not shown), the work function metal layer (not shown), the metals (not shown) and the metal electrode (not shown) are polished by methods such as chemical mechanical polishing process, so that the U-shaped metal layers 162b, the U-shaped work function metal layer 162a, the metal 164b and the metal electrode 164a are formed, wherein the U-shaped metal layers 162b, the U-shaped work function metal layer 162a, the metals 164b and the metal electrode 164a are leveled with the planarized dielectric material 150. Furthermore, a U-shaped barrier layer (not shown) may be respectively formed between each of the U-shaped metal layer 162b and the metal 164b and between the U-shaped work function metal layer 162a and the metal electrode 164a.

Figure 7:
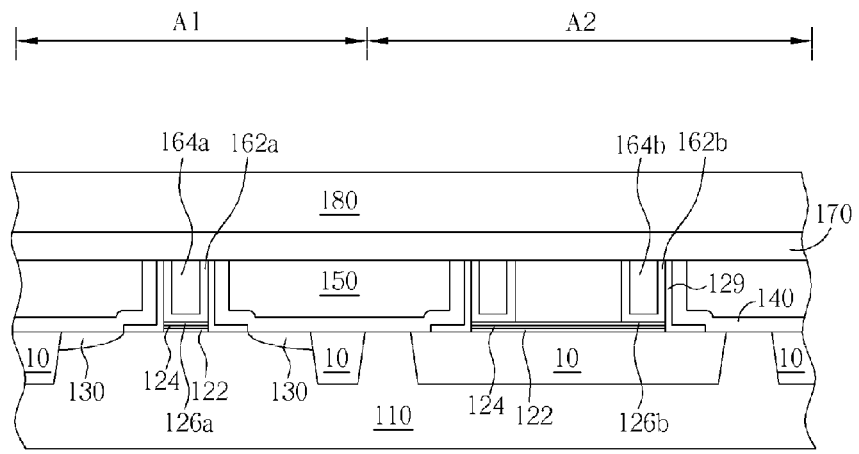

As shown in FIG. 7, a nitrogen doped silicon carbide (NDC) layer 170 may be selectively formed on the planarized dielectric material 150. A dielectric layer 180 is formed to entirely cover the planarized dielectric material 150, the U-shaped metal layers 162b, the metals 164b, the U-shaped work function metal layer 162a and the metal electrode 164a. The dielectric layer 180 may be an oxide layer, but is not limited thereto.

Figure 8:
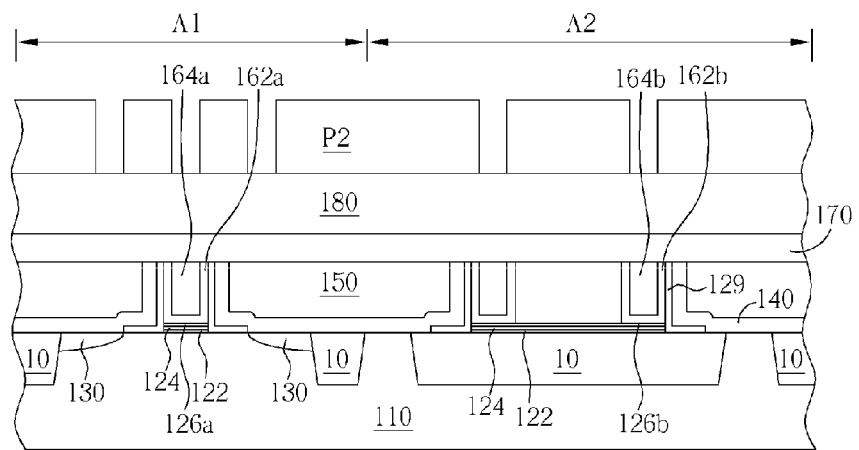
Figure 9:
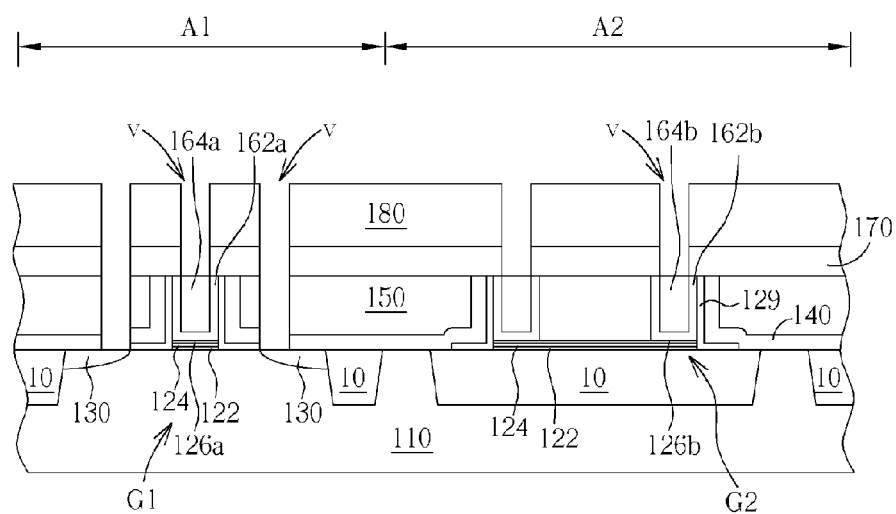

As shown in FIGS. 8-9, a plurality of contact holes V are formed in the dielectric layer 180 and the nitrogen doped silicon carbide (NDC) layer 170 to respectively expose the metals 164b, the metal electrode 164a and the source/drain 130. The method of forming the plurality of contact holes V may be: as shown in FIG. 8, a photoresist layer (not shown) is formed and entirely covers the dielectric layer 180, and then the photoresist layer (not shown) is patterned to form a patterned photoresist layer P2. As shown in FIG. 9, the pattern of the patterned photoresist layer P2 is transferred to the dielectric layer 180 and the nitrogen doped silicon carbide (NDC) layer 170, so that a plurality of contact holes V are formed in the dielectric layer 180 and the nitrogen doped silicon carbide (NDC) layer 170, wherein the plurality of contact holes V penetrate through the dielectric layer 180 and are respectively located on the metals 164b, the metal electrode 164a and the source/drain region 130. The patterned photoresist layer P2 is then removed. A plurality of metal plugs (not shown) such as tungsten plugs may be formed in each of the contact holes V to electrically connect the transistor G1, the resistor structure G2 and the source/drain region 130 with wires.

In sum, the present invention provides a semiconductor structure and process thereof, which replaces the polysilicon layer of the prior art with a dielectric material. Conductive layers such as a barrier layer located below the dielectric material will be used as a resistor, so that a resistor structure is formed. Thus, the problems of difficulty in filling holes, the etched through polysilicon and metals remained because of height difference can be avoided. Moreover, transistors and resistor structures can be formed simultaneously by integrated a transistor process of high-K metal gate in the present invention. That is, semiconductor structures can be formed at the same time by integrated semiconductor processes in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   providing a substrate having an isolation structure;
   forming a sacrificial resistance on the isolation structure, wherein the sacrificial resistance comprises a resist layer located on the isolation structure and a sacrificial layer located on the resist layer;
   removing a middle part of the sacrificial layer so that a first recess is formed and the end sides of the sacrificial layer remain;
   disposing a dielectric material in the first recess;
   removing the two end sides of the sacrificial layer so that two second recesses are respectively formed; and
   sequentially forming a U-shaped metal layer and a metal layer on each of the second recesses.

2. The semiconductor process according to claim 1, wherein the resist layer comprises a barrier layer.

3. The semiconductor process according to claim 1, further comprising:
   sequentially forming a buffer layer on the isolation structure and forming a dielectric layer having a high dielectric constant on the buffer layer before the sacrificial resist is formed.

4. The semiconductor process according to claim 1, wherein the sacrificial layer comprises a polysilicon layer.

5. The semiconductor process according to claim 1, further comprising:
   performing a treatment process to adjust the resistance of the resist layer after the middle part of the sacrificial layer is removed so that the first recess is thereby formed.

6. The semiconductor process according to claim 1, wherein the steps of forming the dielectric material in the first recess comprise:
   forming the dielectric material to entirely cover the substrate, the resist layer and the two end sides of the sacrificial layer; and
   planarizing the dielectric material.

7. The semiconductor process according to claim 1, wherein the steps of removing the two end sides of the sacrificial layer comprise:
   sequentially performing a dry etching process and a wet etching process to remove the two end sides of the sacrificial layer.

8. The semiconductor process according to claim 1, further comprising:
   forming a dielectric layer to entirely cover the dielectric material, the U-shaped metal layers and the metals after the U-shaped metal layer and the metal are sequentially formed on each of the second recesses;
   forming a plurality of contact holes in the dielectric layer to respectively expose each of the metals; and
   forming a plurality of metal plugs in the contact holes.

9. The semiconductor process according to claim 1, wherein the substrate further comprises a resistance area and a transistor area, and the isolation structure is located in the resistance area.

10. The semiconductor process according to claim 9, further comprising:

forming a sacrificial gate on the substrate of the transistor area while a sacrificial resistance is formed on the isolation structure, wherein the sacrificial gate comprises a barrier layer formed on the substrate and a sacrificial gate layer formed on the barrier layer;

removing the sacrificial gate layer and a gate recess formed in the transistor area while the two ends of the sacrificial layer are being removed; and sequentially forming a U-shaped work function metal layer and a metal electrode in the gate recess while the U-shaped metal layers and the metals are respectively formed in the second recesses.

\* \* \* \* \*